(12) United States Patent
Tsuji et al.

(10) Patent No.: US 6,603,532 B2
(45) Date of Patent: Aug. 5, 2003

(54) ILLUMINANCE MEASUREMENT APPARATUS, EXPOSURE APPARATUS, AND EXPOSURE METHOD

(75) Inventors: Toshihiko Tsuji, Chiyoda-ku (JP); Keizaburo Kawada, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/927,935

(22) Filed: Aug. 13, 2001

(65) Prior Publication Data
US 2002/0048007 A1 Apr. 25, 2002

(30) Foreign Application Priority Data

Aug. 15, 2000 (JP) ........................................ 2000-246172

(51) Int. Cl.[7] .................. G03B 27/70; G03B 27/54; G03B 27/32; G01R 11/00; H04N 3/22
(52) U.S. Cl. ........................... 355/66; 355/67; 355/53; 355/69; 355/70; 355/77; 356/399; 356/400; 356/138; 348/745; 348/746; 348/747
(58) Field of Search ................. 355/67, 66, 53, 355/69, 70, 77; 348/745, 746, 747; 250/492.2, 492.22; 356/345, 356, 359, 363, 138, 399, 400

(56) References Cited

U.S. PATENT DOCUMENTS

| 5,004,905 A | * | 4/1991 | Yoshinouchi et al. |
| 5,721,608 A | * | 2/1998 | Taniguchi |
| 5,898,477 A | * | 4/1999 | Yoshimura et al. |
| 5,917,581 A | * | 6/1999 | Suzuki |

FOREIGN PATENT DOCUMENTS

JP    A 2000-114136    4/2000

* cited by examiner

Primary Examiner—Frank G. Font
Assistant Examiner—Khaled Brown
(74) Attorney, Agent, or Firm—Oliff & Berridge

(57) ABSTRACT

An illuminance measurement apparatus of the present invention is comprised of a chassis (20) having a detection surface (22) formed with a light receiving aperture (21) and a light receiving element having a light receiving surface arranged at a position corresponding to the light receiving aperture (21) in the chassis (20), wherein the chassis (20) is provided with a reflection surface (23) for detection light for detecting at least one of the position and posture of the detection surface (22).

10 Claims, 9 Drawing Sheets

ILLUMINANCE MEASUREMENT APPARATUS, EXPOSURE APPARATUS, AND EXPOSURE METHOD

BACKGROUND OF THE INVENTION

1. Field of the Invention

The present invention relates to an illuminance measurement apparatus, exposure apparatus, and exposure method, more particularly relates to an illuminance measurement apparatus used for measuring the illuminance of illumination light irradiated through a projection optical system provided in an exposure apparatus, illumination distribution in a region irradiated by the illumination light, etc., an exposure apparatus provided with such an illuminance measurement apparatus, and an exposure method using such an illuminance measurement apparatus.

2. Description of the Related Art

When producing a semiconductor device, a liquid crystal display device, or other device, use is made of an exposure apparatus for transfer of a pattern drawn on a mask or reticle (hereinafter also referred to all together as a "mask") or other master on to a semiconductor wafer or glass plate coated with a resist or other photosensitive substrate. To form a fine pattern on a photosensitive substrate using an exposure apparatus, it is necessary to strictly manage the illuminance of the illumination light emitted from an excimer laser or mercury lamp or other light source. Therefore, the exposure apparatus is provided with an illuminance measurement apparatus on the stage carrying the photosensitive substrate.

An illuminance measurement apparatus is generally configured by a light receiving element arranged in a chassis. The chassis is a housing formed at its top surface with a light receiving aperture. The light receiving element is set at a position where its light receiving surface corresponds to the light receiving aperture of the chassis, receives the exposure light entering from the light receiving aperture, and outputs an electrical signal corresponding to the illuminance to the outside through a wire etc. Note that an electrical board (printed circuit board) is sometimes also provided inside the chassis. In this case, the light receiving element is mounted on the electrical board. The illuminance of the illumination light is measured before transferring the pattern formed on the mask to the photosensitive substrate. By moving the stage in the in-plane direction of the stage, the light receiving aperture is arranged inside the region illuminated by the exposure light for measurement.

Such an illuminance measurement apparatus is adjusted by a high accuracy so that the height position of the light receiving aperture is in register with the surface of the photosensitive substrate and arranged on the stage carrying the photosensitive substrate. Here, the height position of the light receiving aperture is brought into register with the surface of the photosensitive substrate by a high precision so as to accurately measure the actual amount of exposure when transferring an image of a pattern formed on the mask to the photosensitive substrate. An image of the pattern formed on the mask is transferred to the photosensitive substrate in a state with the height position of the surface of the photosensitive substrate in register with an image plane of the projection optical system.

A reference board having a surface formed with fiducial marks etc. in register with the surface of the photosensitive substrate is provided on the stage. Detection light is irradiated toward the reference board and the reflected light received to find the height position of the reference board and the position of the stage in the height direction is adjusted so that the height position of the reference board is in register with the image plane of the projection optical system, assuming that the height positions of the reference board and light receiving aperture are in register, so that the light receiving aperture is in register with the image plane of the projection optical system.

If the height position of the reference board and the height position of the light receiving aperture are offset from each other, however, the measurement is performed in a state with the light receiving aperture defocused relative to the image plane of the projection optical system and therefore the illuminance or illumination distribution cannot be measured accurately. Therefore, to prevent this inconvenience, it is necessary to set the machining precision high when producing the illuminance measurement apparatus or mounting surface of the stage and to precisely mechanically adjust the height position of the light receiving aperture to strictly be in register with the height position of the reference board.

To bring the height position of the surface of the photosensitive substrate (height position of reference board) and height position of the light receiving aperture formed in the illuminance measurement apparatus into strict register with each other in this way, it is necessary to produce the illuminance measurement apparatus and the mounting surface of the stage with a high processing precision, so a large number of steps were required for machining and assembling the components and the cost became high.

Further, the illuminance measurement apparatus is not placed on the stage at all times. It is attached to the stage when measuring the illuminance of the illumination light before transferring the image of the pattern formed on the mask to the photosensitive substrate. Therefore, fine mechanical adjustment becomes necessary so that the height position of the light receiving aperture becomes accurately in register with the height position of the reference board at the time of mounting. Careful attention is required in the work. Due to the structure of the apparatus, the work is difficult. Along with this, a long time is required for the work. This becomes one reason lowering the throughput. Further, if foreign matter adheres to the back surface of the illuminance measurement apparatus or the mounting surface of the stage, the reproducibility of mounting of the illuminance measurement apparatus deteriorates, the chassis surface where the light receiving aperture is formed becomes tilted, and the precision of setting of the height position falls. If it is not possible to bring the height positions of the light receiving aperture and reference board into accurate register, it is not possible to accurately measure the illuminance and not possible to transfer a pattern with a high precision.

SUMMARY OF THE INVENTION

Therefore, an object of the present invention is to improve the accurately of measurement of the illuminance of exposure light irradiated on a substrate, facilitate processing and assembly, and speed up and facilitate mounting work and thereby reduce costs and improve throughput.

According to a first aspect of the present invention, there is provided an illuminance measurement apparatus having a chassis having a detection surface formed with an aperture and a light receiving element with a light receiving surface arranged at a position corresponding to the aperture in the chassis, wherein the chassis is provided with a reflection surface for detection light for detecting at least one of the position and posture of the detection surface.

According to the present invention, since the chassis having the detection surface formed with the aperture is provided with a reflection surface of the detection light, the relative positional relationship between the detection surface and the reflection surface is fixed unambiguously. Therefore, it becomes possible to adjust the position (and/or posture) of the detection surface based on the results of detection of the reflection surface obtained by irradiating detection light to the reflection surface. As a result, it becomes possible to detect the illuminance with a high precision. Further, since the relative positional relationship between the reflection surface and detection surface does not change, there is less of a need to produce or mount the illuminance measurement apparatus with a high precision than in the past and as a result it is possible to relax the requirement on manufacturing tolerance or mounting tolerance of the illuminance measurement apparatus, reduce the cost, and improve the throughput.

Here, it is possible to provide the reflection surface adjoining the detection surface so that the normal of the reflection surface becomes substantially parallel to the normal of the detection surface. In this case, from the viewpoint of facilitating manufacture or reducing cost etc., it is possible to provide the reflection surface in substantially the same plane as the detection surface or to arrange the reflection surface to be offset relative to the detection surface in the normal direction of the detection surface.

According to a second aspect of the present invention, there is provided an exposure apparatus for transferring a pattern of a mask on to a substrate by exposure light, the exposure apparatus provided with a stage for holding the substrate and adjusting at least one of a position and posture of the substrate, a detection device for irradiating detection light toward an object on the stage and receiving the light reflected at the object to detect at least one of the position and posture of the object, an illuminance measurement apparatus, having a chassis having a detection surface formed with an aperture through which the exposure light enters, a light receiving element having a light receiving surface provided at a position corresponding to the aperture in the chassis, and a reflection surface for reflecting the detection light provided on the chassis, and mounted on the stage, and a control device for controlling the stage so that the detection surface becomes in register with a predetermined reference based on the result of detection of the detection device when irradiating the detection light to the reflection surface.

According to the present invention, the chassis is provided with a reflection surface of detection light for detecting the position (and/or posture) of the detection surface and the position (and/or posture) of the detection surface is adjusted by controlling the stage based on the result of detection of the reflection surface obtained by irradiating detection light on that reflection surface. Since the reflection surface and the detection surface are formed in the same chassis, the relative positional relationship between the reflection surface and the detection surface is fixed unambiguously and does not change, so it becomes possible to measure the illuminance at a high precision and fast speed without that much reliance on the mechanical precision of the illuminance measurement apparatus or the mounting precision on the stage. Therefore, it becomes possible to transfer and form a high precision pattern on a photosensitive substrate by a high throughput. As a result, it becomes possible to produce a high quality, high reliability microdevice etc. The cost of production of such a microdevice therefore also can be reduced.

Here, the control device may have a storage device storing data showing the relative positional relationship between the reflection surface and the detection surface. For example, when the reflection surface is arranged offset from the detection surface in the normal direction of the detection surface, the control device can correct the offset by reading the data indicating the relative positional relationship between the reflection surface and detection surface from the storage device, so even if there is a limit to the positional relationship between the reflection surface and the detection surface, it is possible to measure the illuminance of the exposure light at a high precision. Further, by a main control system 16 outputting a control signal to the illumination light source 1 to change the control parameters, it becomes possible to continuously finely adjust the intensity of the illumination light IL. Note that the control parameters include the voltage or power given to the light source etc.

According to a third aspect of the present invention, there is provided an exposure method for transferring a pattern of a mask on to a substrate by exposure light, the exposure method comprising the steps of mounting an illuminance measurement apparatus having a chassis having a detection surface formed with an aperture through which the exposure light enters, a light receiving device having a light receiving surface provided at a position corresponding to the aperture in the chassis, and a reflection surface provided on the chassis on a stage for holding the substrate and adjusting at least one of a position and posture of the substrate, irradiating detection light toward the reflection surface and receiving the light reflected at the reflection surface to detect at least one of the position and posture of the reflection surface, controlling the stage so that the detection surface becomes in register with a predetermined reference based on the result of detection when irradiating the detection light to the reflection surface, irradiating the exposure light to the detection surface and measuring the illuminance of the exposure light, and adjusting the illuminance of the exposure light and exposing the substrate based on the results of measurement when irradiating the exposure light on the detection surface.

Note that the illuminance measurement apparatus, exposure apparatus, and exposure method of the present invention cover not only the case where the detection surface formed with the aperture and the light receiving surface of the illuminance measurement apparatus are separated in position, but also the case where they are at the same position. For example, there are cases where the detection surface formed with the aperture is formed integrally on the light receiving surface.

According to a fourth aspect of the present invention, there is provided a method of exposure of a second object by exposure light through a first object having a pattern, the exposure method comprising arranging a measurement device having a light receiving surface struck by the exposure light on a movable member able to adjust at least one of the position and posture of the same, detecting information relating to at least one of the position and posture of the detection surface of the measurement device, and driving the movable member to bring the detection surface into register with a predetermined reference based on the information so that the measurement device may detect the exposure light. In this case, to detect that information, it is possible to irradiate detection light to a reflection surface of the measurement device arranged in a predetermined positional relationship with the detection surface and receive the light reflected from that reflection surface.

DESCRIPTION OF THE PREFERRED EMBODIMENTS

Figure 1:
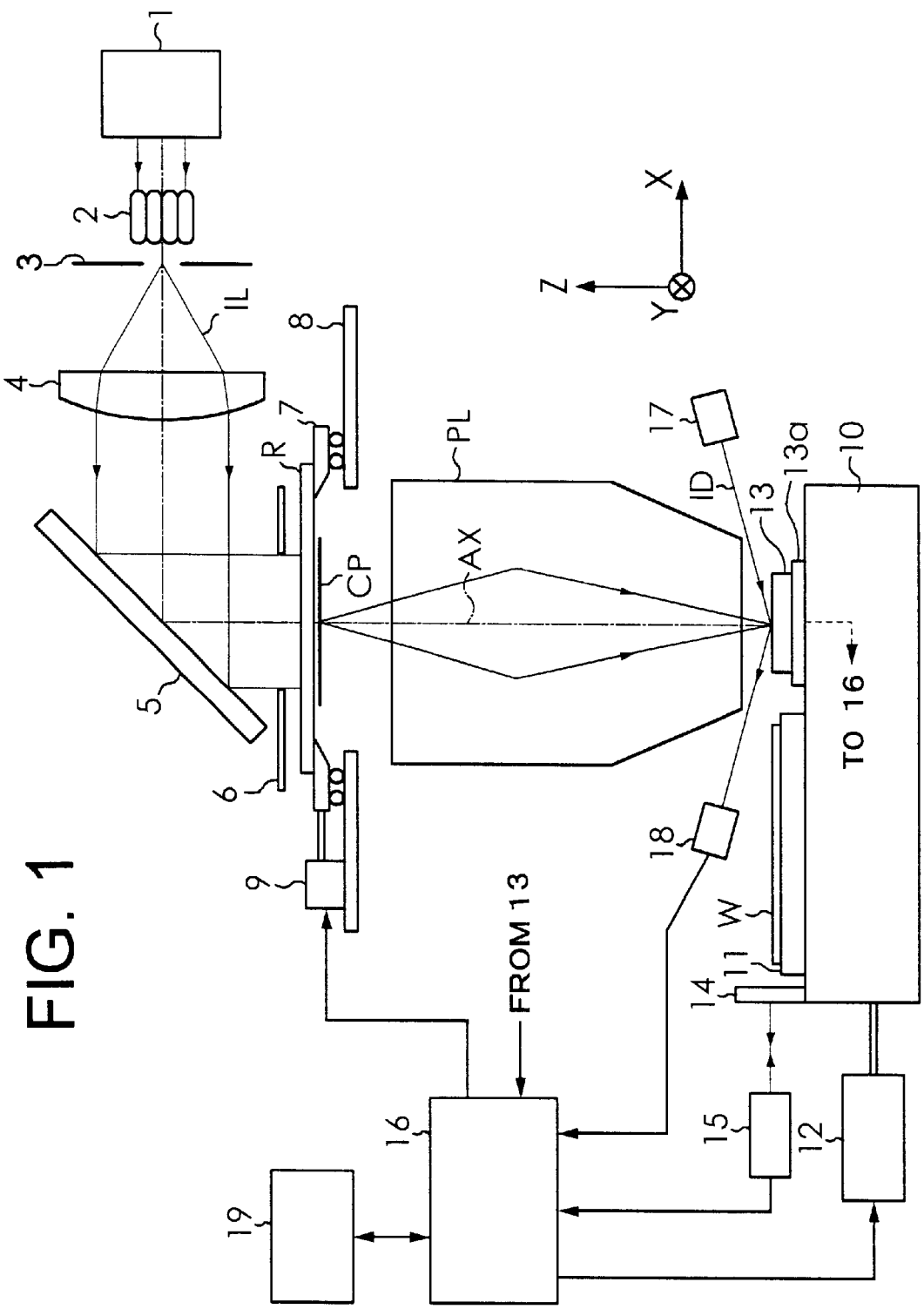
FIG. 1 is a view of the overall configuration of an exposure apparatus provided with an illuminance measurement apparatus according to a first embodiment of the present invention.

Next, a detailed explanation will be made of embodiments of the present invention with reference to the drawings.
First Embodiment FIG. 1 shows the general configuration of an exposure apparatus provided with an illuminance measurement apparatus according to a first embodiment of the present invention. In this embodiment, the explanation will be made taking as an example the case of use of an exposure apparatus of a step-and-repeat type. Further, in the following explanation, the explanation will be made of the positional relationship of the members while setting the XYZ orthogonal coordinate system shown in FIG. 1 and referring to that XYZ orthogonal coordinate system. The XYZ orthogonal coordinate system is set so that the X-axis and Z-axis become parallel to the surface of the paper and so that the Y-axis is in a direction vertical to the paper surface. The XYZ orthogonal coordinate system in the figure is actually set so that the XY plane is parallel to the horizontal plane and the Z-axis is in the perpendicular direction.

In FIG. 1, the illumination light source 1 emits exposure light IL when a control signal instructing emission of exposure light is output from a main control system 16 explained later. As the exposure light IL, for example, g-rays (436 nm), i-rays (365 nm), KrF excimer laser light (248 nm), ArF excimer laser light (193 nm), $F_2$ laser light (157 nm), etc. may be used. Further, while not shown in FIG. 1, the illumination light source 1 is provided with not only a light source, but also a relay optical system, zoom optical system, etc. and is provided with an energy modulator comprised of a plurality of ND filters with different transmittances (=(1−light attenuation rate)×100(%)) arranged on a rotatable revolver. By rotating the revolver under the control of the main control system 16, it is possible to switch the light intensity of the emitted exposure light IL in several stages.

Note that it is also possible to arrange two revolvers similar to the revolver and use a combination of two ND filters to finely adjust the transmittance. Further, the exposure light source 1 is provided with a shutter (not shown) for stopping the emission of the exposure light IL. The exposure light IL emitted from the illumination light source 1 travels via an optical integrator (rod integrator or fly eye's lens etc., in the figure, a fly eye's lens) 2, an aperture stop (α-stop) 3, and a condenser lens 4 to strike a mirror 5 for bending the optical path.

The exposure light IL bent to a substantially right angle by the dichroic mirror 5 passes through a reticle blind 6 provided for restricting the region of the reticle R which the exposure light IL illuminates and illuminates the circuit pattern CP of the device pattern by a substantially uniform illuminance. At the time of exposure, an image of the circuit pattern CP on the reticle R is projected on the wafer W serving as the workpiece through the projection optical system PL. The reticle R is arranged on the object plane side of the projection optical system PL, while the wafer W is arranged at the image plane side. Note that FIG. 1 illustrates the state when measuring the illuminance of the exposure light IL. Therefore, the wafer W is not arranged in the exposure region of the projection optical system PL. Further, the region which exposure light IL is blocked from by the reticle blind 6 is controlled by the main control system 16.

The reticle R is held by a reticle holder 7. The reticle holder 7 is supported to be able to move and rotate slightly in the XY plane on a base 8. The main control system 16 controlling the operation of the apparatus as a whole controls the operation of the reticle holder 7 through a drive 9 on the base 8 so as to set the position of the reticle R. Further, the positions of the reticle holder 7 in the X-axial direction and Y-axial direction are constantly detected by a laser interferometer (not shown) arranged around the reticle holder 7 by a resolution of for example about 0.6 nm. When performing exposure, the image of the circuit pattern CP drawn on the reticle R is projected on a shot positioned at the center of the exposure region of the projection optical system PL among the shot areas set on the wafer W. The projection optical system PL has a reduction rate of for example ¼ or ⅕ and has an optical axis AX set perpendicular to the reticle R and wafer W. The projection optical system PL has a plurality of lenses and other optical elements. The material of the optical elements is selected from quartz, fluorite, and other optical materials in accordance with the wavelength of the exposure light IL.

The wafer W is held by suction on a wafer holder 11 on a wafer stage 10. The wafer stage 10 is designed to be able to move in a plane (XY plane) vertical to the optical axis AX of the projection optical system PL by a drive motor 12. The wafer stage 10 is made to move by a step-and-repeat system to transfer the circuit pattern CP of the reticle R on the individual shot areas set on the wafer W. Further, the wafer holder 11 is affixed to a table (not shown) supported on the wafer stage 10 via three actuators (for example voice coil motors etc.). Using these three actuators, the table can move in the optical axis AX direction (Z-axial direction) of the projection optical system PL and can be freely tilted with respect to the XY plane so as to bring the surface of the wafer W in the exposure region of the projection optical system PL into register with the image plane of the projection optical system PL. Note that the table can also be configured to be rotated slightly in the XY plane.

Further, an illuminance measurement apparatus 13 according to the present invention for measuring the illuminance of the exposure light IL irradiated through the projection optical system PL is arranged at a position close to the wafer holder 11 on the wafer stage 10. This illuminance measurement apparatus 13 is arranged on the wafer stage 10 through the pedestal 13a prepared using a material with a high heat conductivity and is configured to be attachable and detachable to and from the pedestal 13a. Note that in the present embodiment, the pedestal 13a is fixed to the above-mentioned table (not shown) where the wafer holder 11 is arranged on the wafer stage 10.

An L-shaped moving mirror 14 is attached to one end of the top surface of the wafer stage 10. A laser interferometer 15 is arranged at a position facing the mirror surface of the moving mirror 14. While the illustration is simplified in FIG. 1, the moving mirror 14 is configured from a flat mirror having a mirror surface vertical to the X-axis and a flat mirror having a mirror surface vertical to the Y-axis. Further, the laser interferometer 15 is configured by two X-axis laser interferometers for emitting a laser beam on the moving mirror 14 along the X-axis and a Y-axis laser interferometer for emitting the laser beam to the moving mirror 14 along the Y-axis. The X-coordinate and Y-coordinate of the wafer stage 10 are measured by one X-axis laser interferometer and the single Y-axis laser interferometer. Further, the rotational angle (rotational angle around the Z-axis) of the wafer stage 10 in the XY plane is measured by the difference of the measured values of the two X-axis laser interferometers. Note that it is also possible to add one X-axis laser interferometer and one Y-axis laser interferometer each to enable measurement of the rotational angle of the wafer stage 10 in the YZ plane (rotational angle around the X-axis) and the rotational angle in the XZ plane (rotational angle around the Y-axis) by the laser interferometer 15.

The information on the X-coordinate, Y-coordinate, and rotational angle measured by the laser interferometer 15 is output as positional information to the main control system 16. The main control system 16 controls the positioning operation of the wafer stage 10 through the drive motor 12 while monitoring the supplied positional information. Further, while not shown in FIG. 1, the reticle holder 7 is also provided with members similar to the moving mirror 14 and laser interferometer 15 provided at the wafer stage 10. The information of the XYZ position etc. of the reticle holder 7 is input to the main control system 16.

Further, the position of the wafer W (or illuminance measurement apparatus 13) in the Z-axial direction is measured by a focal position detection system of a so-called tilted incidence type (hereinafter the projection system 17 and the receiving system 18 also being called the "tilted incidence optical systems 17 and 18"). The detection light ID emitted from the projection system 17 is of a wavelength band not sensitizing the photoresist on the wafer W and projects an image of the pinhole or slit on the wafer W at a tilt relative to the optical axis AX. The receiving system 18 is designed so that the position of the reflected image from the wafer W is in register with the pinhole or slit in the receiving system 18 when the surface of the wafer W is in register with the image plane of the projection optical system.

Further, the tilted incidence optical systems 17 and 18 are so-called multipoint AF sensors which project detection light ID on a plurality of measurement points set in an exposure region of the projection optical system PL and detect the position of the wafer W by the measurement points in the Z-axial direction along the optical axis AX of the projection optical system PL. Therefore, by detecting the positional information of the wafer W (shot area) in the Z-axial direction at the different plurality of measurement points, it is possible to find the tilt of the wafer W surface with respect to the image plane of the projection optical system PL.

The detection signal from the receiving system 18 corresponding to the Z-axial direction position of the wafer W is sent to the main control system 16. Based on the detection signal, the main control system 16 controls the table of the wafer stage 10 so that the surface of the wafer W comes into register with the image plane of the projection optical system PL. Further, the receiving system 18 includes a plane-parallel plate (not shown) for shifting the light beam. Even if there is a fluctuation in the image plane of the projection optical system PL, the angle of this plane-parallel plate is adjusted so that the reflected light from the wafer W plate is in register with the pinhole or slit on the image plane of the receiving system 18 at all times. The tilted incidence optical systems 17 and 18 show examples of Z-axial direction detection sensors, but there are also systems detecting the position of the reflected light of the slit images by line sensors etc. Measurement is also possible by these systems.

The detection signal of the illuminance measurement apparatus 13 is also sent to the main control system 16. The main control system 16 outputs a control system to the illumination light source 1 to adjust the intensity of the illumination light IL emitted from the illumination light source 1. Further, the exposure apparatus according to the present embodiment is provided with a not shown off-axis alignment sensor at the side of the projection optical system PL. This alignment sensor is a field image alignment (FIA) type alignment sensor and measures the positional information of alignment marks (not shown) formed corresponding to shot areas set on the wafer W. Further, reference numeral 19 in FIG. 1 is a storage device for storing in advance information relating to the shape of the illuminance measurement apparatus 13 (step difference between detection surface and reflection surface). Details will be explained below.

Figure 2:
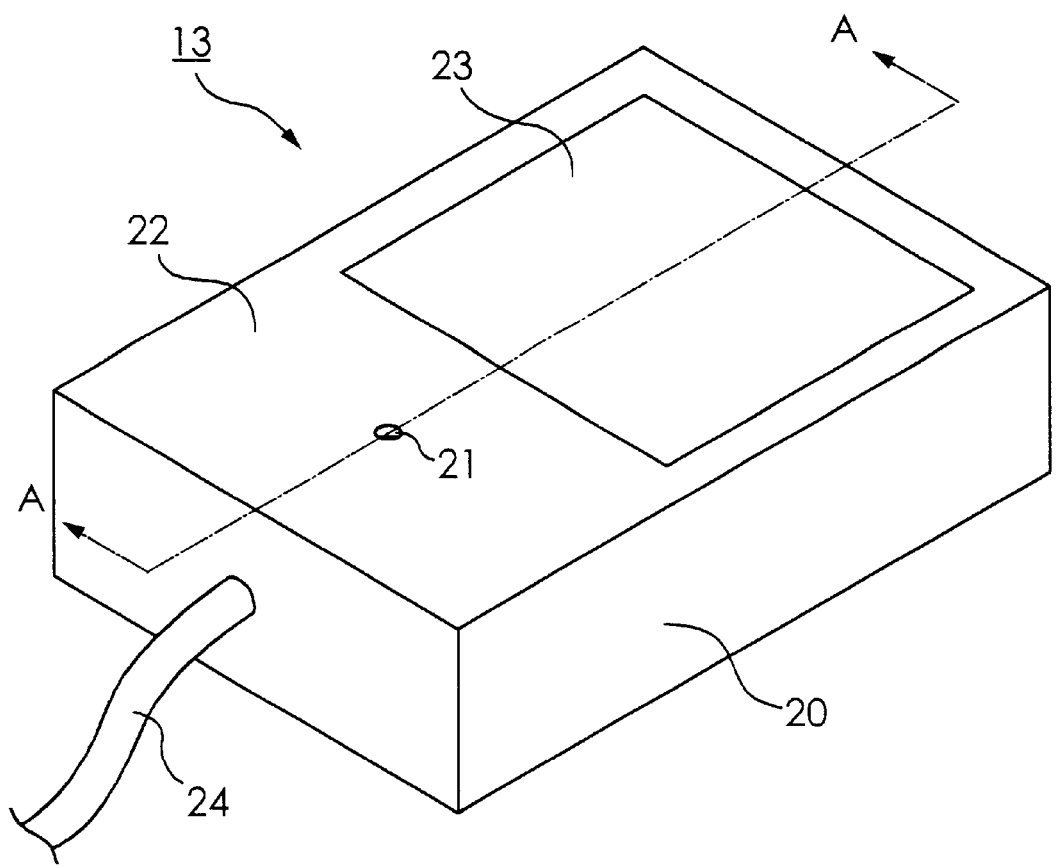
FIG. 2 is a perspective view of the configuration of the illuminance measurement apparatus according to the first embodiment of the present invention.

FIG. 2 is a perspective view of the configuration of the illuminance measurement apparatus according to the first embodiment of the present invention. As shown in FIG. 2, the illuminance measurement apparatus 13 is provided with a substantially parallelopiped shaped chassis 20. The chassis 20 is a housing formed by a metal with a high heat conductivity, for example, aluminum, and is provided at its top surface with a detection surface 22 having a light receiving aperture 21 and with a reflection surface 23.

The light receiving aperture 21 formed in the detection surface 22 is provided for measuring the illuminance of the exposure light IL emitted through the projection optical system PL. The reflection surface 23 is provided for measuring the position of the detection surface 22 (chassis 20) in the Z-axial direction and its tilt relative to the image plane of the projection optical system PL by the tilted incidence optical systems 17 and 18. The reflection surface 23 is formed to dimensions (for example, 15 mm×15 mm) of an extent enabling reflection of the detection light ID used in the tilted incidence optical systems 17 and 18 shown in FIG. 1. The reflection surface 23 is formed for example by bonding a glass plate having a high flatness on to the chassis 20 or polishing that portion of the top surface of the chassis 20 and depositing aluminum. Further, in FIG. 2, 24 indicates a wire for taking out the detection signal of the light receiving element (not shown in FIG. 2) outside of the illuminance measurement apparatus 13.

Figure 3:
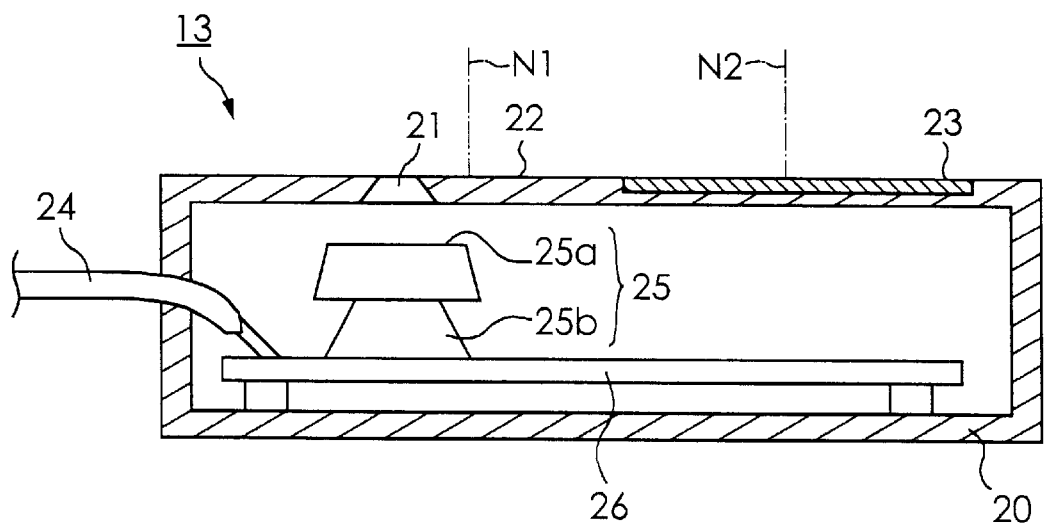
FIG. 3 is a sectional view along the line A—A in FIG. 2.
Figure 4:
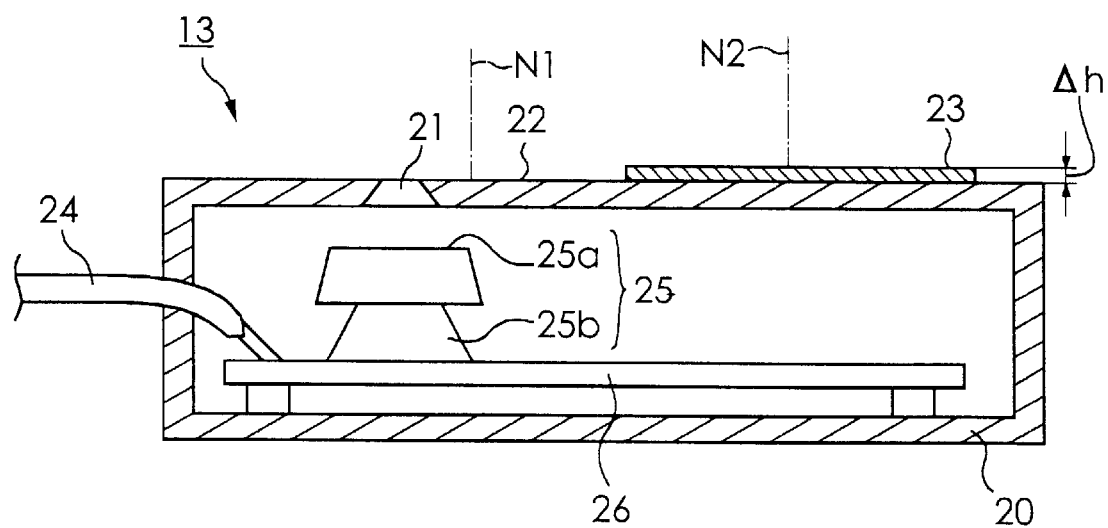
FIG. 4 is a sectional view along the line A—A in FIG. 2.

FIG. 3 and FIG. 4 are sectional views taken along the line A—A in FIG. 2. As shown in FIG. 3 and FIG. 4, the illuminance measurement apparatus 13 is provided with a light receiving element 25 having a light receiving surface 25a arranged at a position corresponding to the light receiving aperture 21 in the chassis 20. The light receiving element 25 is for example a PIN photodiode and is attached to an electrical board 26 through legs 25b. The wire 24 is connected to the electrical board 26 and takes out the detection signal of the light receiving element 25 outside of the illuminance measurement apparatus 13. As the light receiving element 25 here, it is also possible to use a photo conversion element utilizing for example the photovoltaic, Schottkey effect, photoelectromagnetic effect, photoconduction effect, photoelectron emission effect, pyroelectric effect, etc.

As shown in FIG. 3 and FIG. 4, the detection surface 22 and reflection surface 23 are provided adjoining each other so that the normal N1 of the detection surface 22 and the normal N2 of the reflection surface 23 become substantially parallel. Here, the reflection surface 23 may be formed so that the reflection surface 23 and the detection surface 22 are arranged in substantially the same plane as shown in FIG. 3 or the reflection surface 23 may be formed so that it becomes offset relative to the detection surface 22 in the normal direction as shown in FIG. 4. When using the configuration shown in FIG. 4, however, it is necessary to precisely measure the offset between the detection surface 22 and the reflection surface 23 in advance. Further, this offset is set to no more than the value which can be corrected by movement of the wafer stage 10 (above-mentioned table) in the Z-axial direction based on the detection signals of the tilted incidence optical systems 17 and 18. This offset between the detection surface 22 and the reflection surface 23 is stored in the storage device 19 shown in FIG. 1.

Further, the normal N1 of the detection surface 22 and the normal N2 of the reflection surface 23 are set to be substantially parallel to the optical axis AX of the projection optical system PL shown in FIG. 1. The Z-axial direction position of the detection surface is set to the same position as the top surface of the wafer W. If the reflection surface 23 is brought too close to the light receiving aperture 21, however, when arranging the light receiving aperture 21 in the exposure region of the projection optical system PL and measuring the illuminance of the exposure light IL, the exposure light IL will be reflected by the reflection surface 23, multiple reflection will occur between the reflection surface 23 and the projection optical system PL, and the multiply reflected light will enter the light receiving aperture 21, so the exposure light IL will not be able to be accurately measured for illuminance. Therefore, the reflection surface 23 has to be arranged at a position not causing this inconvenience.

The detection surface 22 formed with the light receiving aperture 21 and the reflection surface 23 are provided adjoining each other on the top surface of the chassis 20 in this way so as to measure the illuminance of the exposure light IL with a high precision. That is, it is possible to use the tilted incidence optical systems 17 and 18 to measure the Z-axial direction position of the reflection surface 23 and the tilt relative to the image plane of the projection optical system PL and to bring the reflection surface 23 into register with the image plane of the projection optical system PL based on the measurement results. As explained above, the normal N1 of the detection surface 22 is set to be substantially parallel to the normal N2 of the reflection surface 23, so by making the illuminance measurement apparatus 13 move parallel in the XY plane in the state with the reflection surface 23 in register with the image plane of the projection optical system PL, it is possible to bring the detection surface 22 into register with the image plane of the projection optical system PL.

Here, when the reflection surface 23 is offset relative to the detection surface 22 as shown in FIG. 4, it is possible to bring the detection surface 22 into register with the image plane of the projection optical system PL by making the illuminance measurement apparatus 13 move in the normal direction N2 of the reflection surface 23 while taking into consideration this offset. In this way, since the detection surface 22 and the reflection surface 23 are provided adjoining each other and the amount of movement when bringing the detection surface 22 into register with the image plane of the projection optical system PL based on the measurement results of the reflection surface 23 is small, it is possible to bring the detection surface 22 into register with the image plane of the projection optical system PL with a high precision and as a result possible to measure the illuminance of the exposure light IL with a good precision.

Note that the light receiving element 25 is not limited to one placed in the chassis 20. That is, the light receiving surface 25a may be provided in the chassis 20 or for example one end face (light receiving surface) of an optical fiber may be placed in the chassis 20 and the light transmitted to the light receiving element 25 outside the chassis 20 through this optical fiber. In this case, the electrical board 26 to which the light receiving element 25 is mounted is also placed outside the chassis 20. Of course, it is also possible to make dual use of an optical fiber or use a mirror or other optical element alone so as to lead the exposure light IL passing through the light receiving aperture 21 outside of the chassis 20. In this case, it is possible to use a photomultiplier or other photoelectric conversion device instead of the light receiving element 25.

Figure 5:
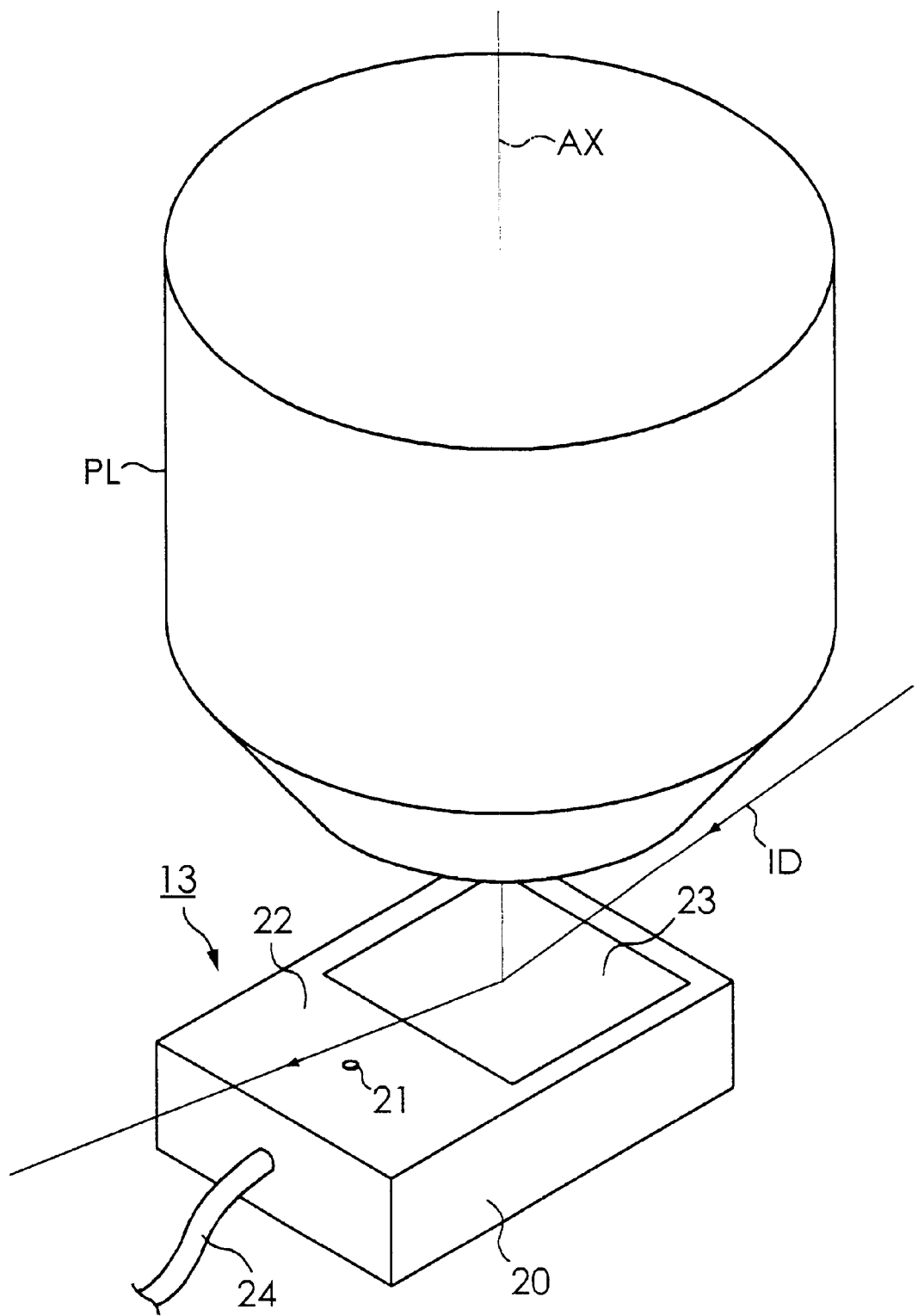
FIG. 5 is a perspective view of the state where a reflection surface is arranged in an exposure region of a projection optical system of the first embodiment of the present invention.

Next, an explanation will be made of the operation of the exposure apparatus of the first embodiment. Before the exposure apparatus transfers the image of the circuit pattern CP formed on the reticle R on to the wafer W, the illuminance measurement apparatus 13 is placed on the pedestal 13a provided on the wafer stage 10. When the illuminance measurement apparatus 13 is placed on the pedestal 13a, the main control system 16 makes the wafer stage 10 move in the XY plane through the drive motor 12 while monitoring the positional information measured by the laser interferometer 15 so that the reflection surface 23 provided in the illuminance measurement apparatus 13 is arranged in the exposure region of the projection optical system PL. At this time, the main control system 16 controls the Z-stage to arrange it at a position where it is predicted that the reflection surface 23 will register with the image plane of the projection optical system PL. FIG. 5 is a perspective view of the state where the reflection surface 23 is arranged in the exposure region of the projection optical system PL. Note that the exposure region of the projection optical system PL is the projection region conjugate with the illumination region where the exposure light IL is irradiated on the reticle R and where the projected image of the circuit pattern CP of the reticle is formed.

When the reflection surface 23 finishes being arranged in the exposure region of the projection optical system PL, the projection system 17 projects the detection light ID to a plurality of measurement points set in the exposure region of the projection optical system PL. The projected detection light ID is reflected by the reflection surface 23 arranged in the exposure region and enters the receiving system 18. The receiving system 18 detects the position of the reflection surface 23 in the Z-axial direction at the measurement points and detects the position of the reflection surface 23 in the Z-axial direction and the tilt of the reflection surface 23 relative to the image plane of the projection optical system PL from these detection results. The detection results are output to the main control system 16.

The main control system 16 drives the wafer stage 10 (above-mentioned table) in this embodiment based on the detection results of the tilted incidence optical systems 17 and 18 so as to control the Z-axial direction position and tilt (posture) of the reflection surface 23 and bring the reflection surface 23 into register with the image plane of the projection optical system PL. When the detection surface 22 and the reflection surface 23 are arranged in substantially the same plane as shown in FIG. 3, this processing results in the Z-axial direction position of the detection surface 22 registering with the Z-axial direction position of the image plane of the projection optical system PL and the detection surface 22 being included in the same plane as the image plane of the projection optical system PL. At this time, when the detection surface 22 and the reflection surface 23 are offset as shown in FIG. 4, the main control system 16 reads out the offset stored in advance in the storage device 19 and corrects the position in the Z-axial direction by exactly the read offset.

Figure 6:
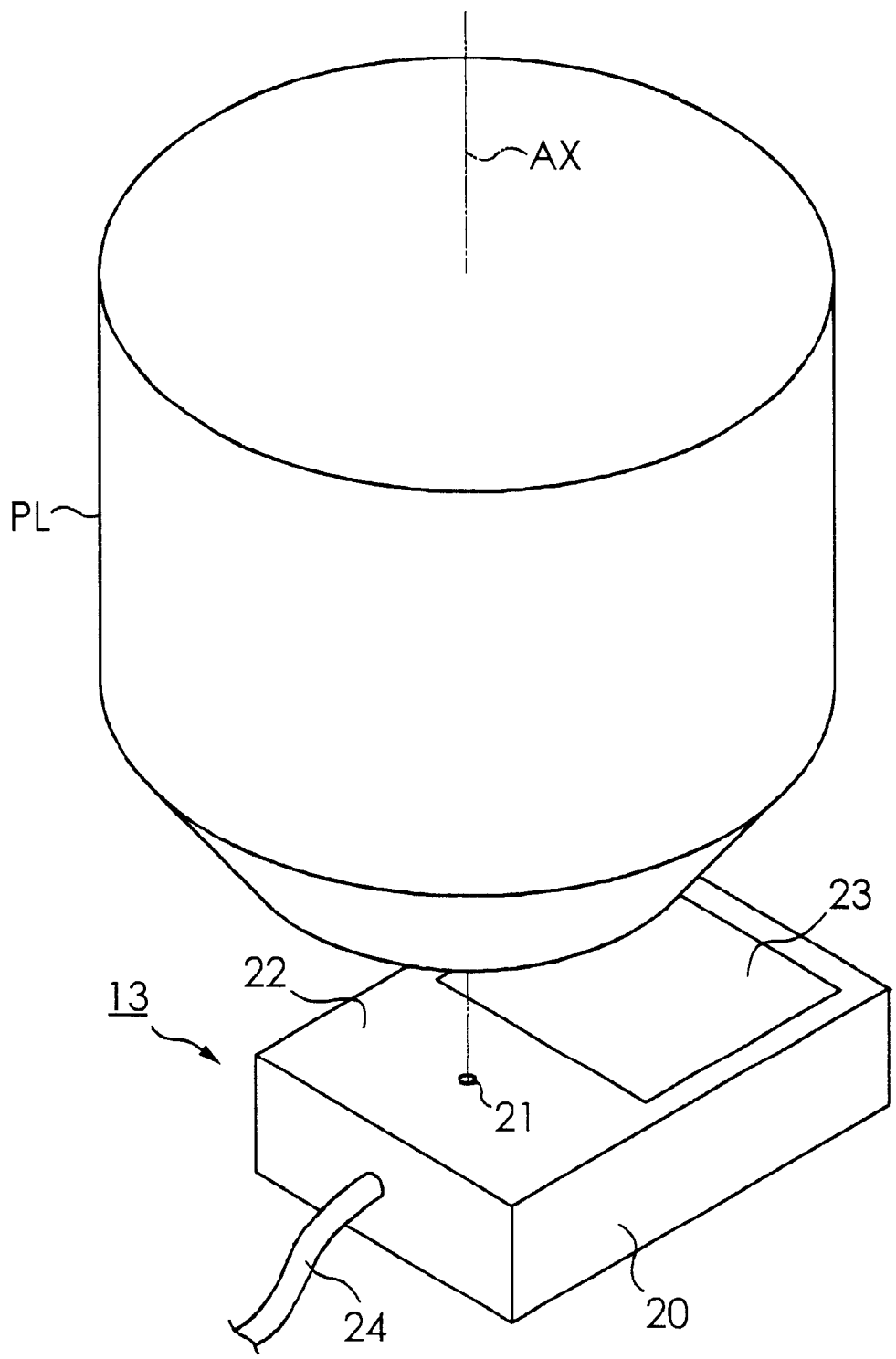
FIG. 6 is a perspective view of the state where a detection surface is arranged in an exposure region of a projection optical system of the first embodiment of the present invention.

When the above processing ends, the main control system 16 makes the wafer stage 10 move in parallel in the XY plane through the drive motor 12 while monitoring the positional information measured by the laser interferometer 15 so as to arrange the detection surface 22 provided in the illuminance measurement apparatus 13 in the exposure region of the projection optical system PL and bring the detection surface 22 into register with the image plane of the projection optical system PL. FIG. 6 is a perspective view of the state where the detection surface 22 is arranged in the exposure region of the projection optical system PL.

In the state with the detection surface 22 in register with the image plane of the projection optical system PL, the main control system 16 outputs a control signal instructing emission of exposure light to the illumination light source 1 and causes exposure light IL to be emitted from the illumination light source 1. The exposure light IL emitted from the exposure light source 1 successively travels via the optical integrator 2, aperture stop 3, and condenser lens 4 to strike the dichroic mirror 5 for bending the optical path. The exposure light IL bent substantially at a right angle at the dichroic mirror 5 passes through the reticle blind 6 provided for restricting the region of the reticle R which the exposure light IL illuminates, illuminates the circuit pattern CP by a substantially uniform illuminance, and strikes the detection surface 22 of the illuminance measurement apparatus 13 through the projection optical system PL.

The light passing through the light receiving aperture 21 out of the exposure light IL irradiating the detection surface 22 strikes the light receiving surface 25a of the light receiving element 25 where it is converted to a voltage which is then amplified by the electrical board 26 and output through the wire 24 outside of the illuminance measurement apparatus 13. The illuminance measurement apparatus 13 is moved so that the light receiving aperture 21 is positioned at a predetermined point in the exposure region of the projection optical system PL and the illuminance of the exposure light IL is measured at that point. By successively arranging the light receiving aperture 21 at a plurality of points in the exposure region and measuring the intensity of the exposure light IL at those points, it is possible to find the illumination distribution of the exposure light IL and the width of the exposure region of the exposure light IL etc. The detection signal output from the illuminance measurement apparatus 13 is input to the main control system 16. The main control system 16 outputs a control signal to the illumination light source 1 based on this detection signal to adjust the intensity of the exposure light IL emitted from the illumination light source 1. At this time, it is possible to change only the above-mentioned control parameters of the light source (voltage, power, etc.) to adjust the intensity of the exposure light IL or to additionally or solely rotate the revolver to change the ND filter to adjust the intensity of the exposure light IL.

After adjusting the intensity of the exposure light IL by the above processing, the main control system 16 closes the shutter of the illumination light source 1 to stop the emission of exposure light IL. In this state, the main control system 16 makes the wafer stage 10 move in the XY plane through the drive motor 12 so as to bring a predetermined shot area of the wafer W into register with the exposure region of the projection optical system PL and adjusts the Z-axial direction position and tilt relative to the image plane of the projection optical system PL to bring the shot area into register with the image plane of the projection optical system PL.

Next, the main control system 16 opens the shutter of the illumination light source 1 to make it emit exposure light IL. When this exposure light IL illuminates the reticle R, an image of the circuit pattern CP is formed. This image is reduced and transferred on a shot area of the wafer W through the projection optical system PL. When the circuit pattern CP finishes being transferred, the main control system 16 makes the wafer stage 10 move to position the next shot area in the exposure region of the projection optical system PL and adjusts the Z-axial direction position and tilt relative to the image plane of the projection optical system PL to bring the shot area into register with the image plane of the projection optical system PL and transfer the circuit pattern CP in the same way as above. By repeating this step motion of the wafer stage 10 and projection exposure, a plurality of regularly arranged patterns are formed on the wafer W. Note that when the illumination light source 1 has a pulse light source, it is also possible not to provide or use a shutter but to control the irradiation of the exposure light IL by a trigger signal to the pulse light source. Further, in this embodiment, the illuminance measurement apparatus 13 was made one attached to the wafer stage 10, but it is also possible to provide a movable member separate from the wafer stage 10 at the image plane side of the projection optical system PL and attach the illuminance measurement apparatus 13 to that movable member.

Further, in the above explanation, the explanation was given taking as an example an exposure apparatus of the step-and-repeat type, but use may also be made of a scan type exposure apparatus of the step-and-scan type. In recent years, the step-and-scan type and other scan type exposure apparatuses have come into attention as means for transferring a pattern of a larger area reticle R onto a wafer W without increasing the size of the projection optical system PL. This type of exposure apparatus operates in synchronization with the scan motion of the reticle R in the direction vertical to the optical axis L of the projection optical system PL to scan the wafer W at the same ratio of speed as the magnification rate of the projection optical system PL in the corresponding direction (for example, the opposite direction) and successively transfer the image of the pattern of the reticle R on the shot areas.

Further, the illuminance measurement apparatus 13 explained above is formed with a pinhole shaped light receiving aperture 21 in its detection surface 22. The explanation was made taking as an example the case of arranging the light receiving aperture 21 at a plurality of points in the exposure region of the projection optical system PL when measuring the illumination distribution of the exposure light IL, but it is also possible to use a one-dimensional line sensor and scan a predetermined direction (for example, the X-axial direction) to measure the illumination distribution of the exposure light IL. In this case, the light receiving aperture 21 is formed into a slit shape with a longitudinal direction set to a direction perpendicular to the scan direction (for example, the Y-axial direction) and the longitudinal direction of the one-dimensional line sensor is set to a position along the longitudinal direction of the light receiving aperture 21. This is particularly effective in a scan type exposure apparatus. When the exposure region in the field of the projection optical system PL is limited to a rectangular shape or arc shape extending in the non-scan direction perpendicular to the scan direction of the wafer W, for example the one-dimensional line sensor may be made to move in the non-scan direction with its longitudinal direction in register with the scan direction.

Second Embodiment

Next, a second embodiment of the present invention will be explained in detail. In the first embodiment of the present invention explained above, the illuminance of the exposure light IL was measured in the state with the illuminance measurement apparatus 13 shown in FIG. 2 to FIG. 4 placed on the wafer stage 10 through a pedestal 13a. The second embodiment of the present invention explained below uses a wafer type illuminance measurement apparatus instead of the illuminance measurement apparatus shown in FIG. 2 to FIG. 4 and measures the illuminance of the exposure light IL in the state with the illuminance measurement apparatus placed on the wafer holder 11. By using such a wafer type illuminance measurement apparatus, there is no need to provide the above pedestal 13a on the wafer stage 10, it is possible to eliminate the trouble of placing the illuminance measurement apparatus 13 on the pedestal 13a, and the work efficiency can be improved.

Figure 7:
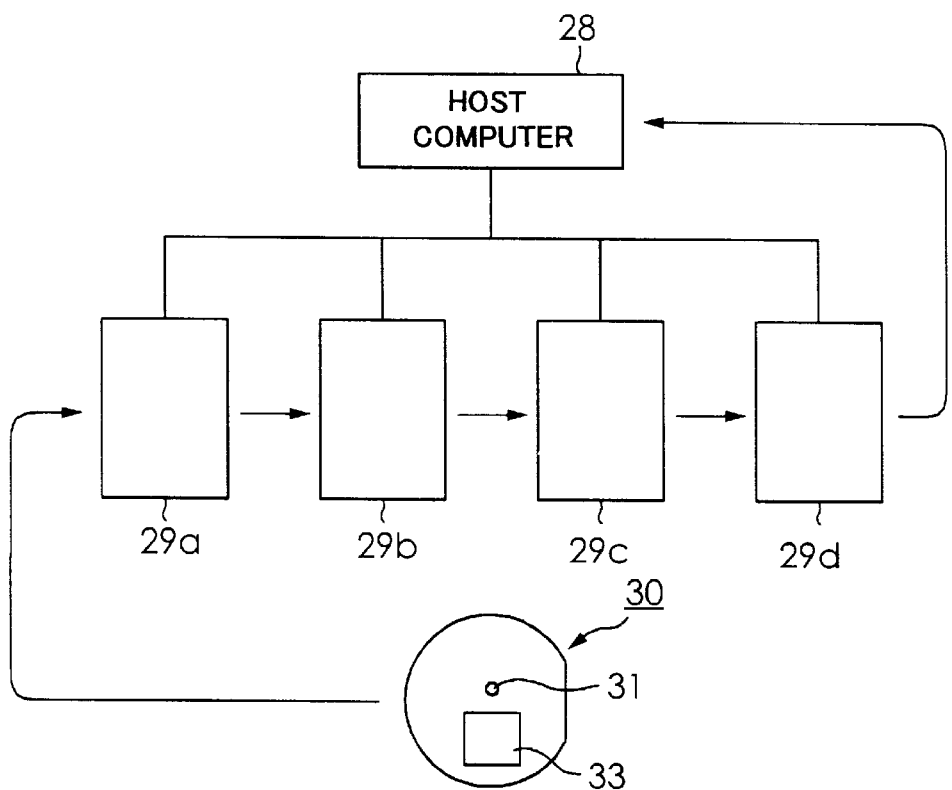
FIG. 7 is a general view of the configuration of a lithographic system comprised of a plurality of exposure apparatuses according to a second embodiment of the present invention.

FIG. 7 is a schematic view of the configuration of a lithography system. The system is comprised of a plurality of exposure apparatuses 29a to 29d and a host computer 28 for controlling the exposure apparatuses 29a to 29d. This system is a lithography system including a mix of exposure apparatuses using a KrF excimer laser as a light source and exposure apparatuses using an ArF excimer laser as a light source. In this system, the wafer type illuminance measurement apparatus (inter-apparatus luminance meter) 30 is circulated among the exposure apparatuses 29a to 29d to measure the illuminance of the illumination light IL and automatically adjust (match) the illuminance of the exposure light IL among the exposure apparatuses.

Figure 8:
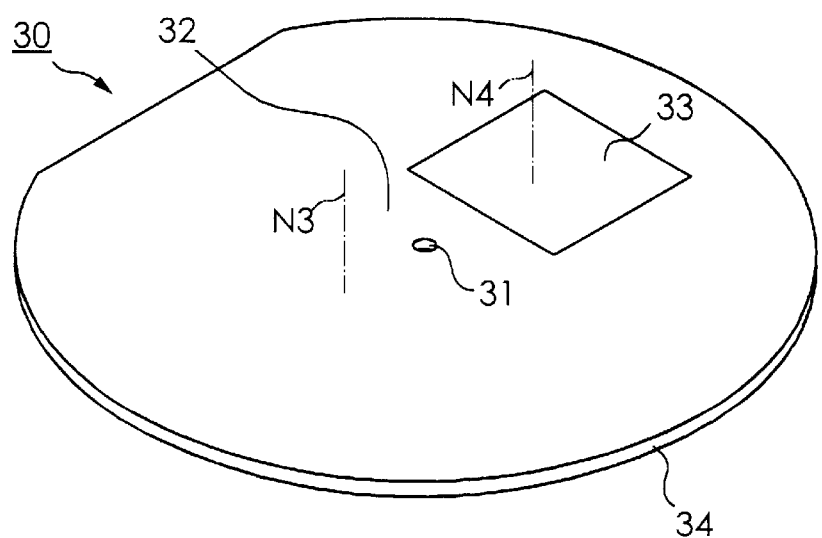
FIG. 8 is a perspective view of the configuration of an illuminance measurement apparatus according to the second embodiment of the present invention.

Next, the wafer type illuminance measurement apparatus 30 will be explained in detail. FIG. 8 is a perspective view of the configuration of the illuminance measurement apparatus according to the second embodiment of the present invention. This illuminance measurement apparatus 30 is provided on its top surface with a detection surface 32 formed with a pinhole-shaped light receiving aperture 31 and with a reflection surface 33. The light receiving aperture 31 formed on the detection surface 32 is provided for measuring the illuminance of the exposure light IL irradiated through the projection optical system PL and is provided at the substantial center of a dummy wafer 34 formed to substantially the same shape as the wafer W. Further, while illustration is omitted in FIG. 7, a light receiving element having a light receiving surface arranged corresponding to the position of formation of the light receiving aperture 31 is provided inside the dummy wafer 34. The reflection surface 33 is provided for measuring the Z-axial direction position of the wafer W and the tilt relative to the image plane of the projection optical system PL by the tilted incidence optical systems 17 and 18 shown in FIG. 1. The reflection surface 33 is formed to dimensions (15 mm×15 mm) of an extent enabling reflection of the detection light ID in the same way as the reflection surface 23 provided in the illuminance measurement apparatus 13 shown in FIG. 2.

Further, the detection surface 32 and reflection surface 33 are provided adjoining each other so that the normal N3 of the detection surface 32 and the normal N4 of the reflection surface 33 become substantially parallel. Further, in the same way as the first embodiment, the reflection surface 33 may be formed so that the reflection surface 33 and detection surface 32 are arranged in substantially the same plane or the reflection surface 33 may be formed so that it is offset relative to the detection surface 32 in the normal direction. In this case as well, it is necessary to arrange the reflection surface 33 at a position where no inconvenience arises due to multiple reflection between the reflection surface 3 and the projection optical system PL. Here, the outside shape of the dummy wafer 34 is shown as a circular disk, but the invention is not limited to this shape. For example, in an exposure apparatus for producing a liquid crystal display device, it may be shaped substantially the same as the glass substrate being exposed, that is, a rectangular shape.

Figure 9:
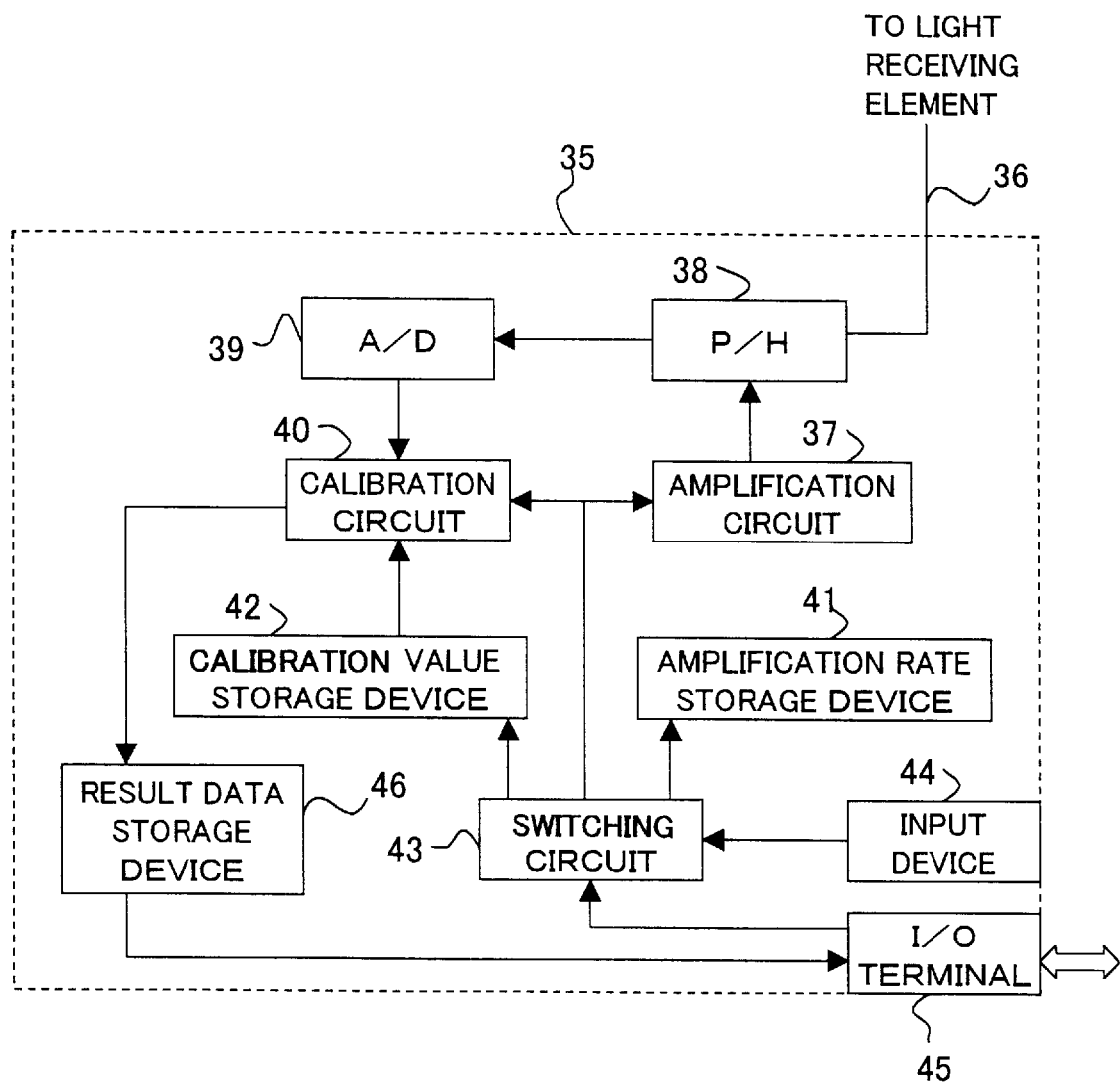
FIG. 9 is a block diagram of the electrical configuration of an illuminance measurement apparatus circuit of the second embodiment of the present invention.

Further, the dummy wafer 34 is provided inside it with an illuminance measurement apparatus circuit 35. FIG. 9 is a block diagram of the electrical configuration of this illuminance measurement apparatus circuit 35. The illuminance measurement apparatus circuit 35 has an amplification circuit 37 for receiving as input the illuminance signal output from the light receiving element through the wire 36. The amplification circuit 37 is connected to an amplification rate storage device 41 and amplifies the illuminance signal output from the light receiving element by the amplification rate stored in the amplification rate storage device 41. The amplification rate storage device 41 stores amplification rates preset in accordance with the type of the exposure use illumination light. In the present embodiment, it stores KrF amplification rates for the KrF exposure use illumination light and ArF amplification rates for the ArF exposure use illumination light.

The amplification circuit 37 has connected to it a peak hold (P/H) circuit 38 which is designed to hold the peak value of the illuminance signal amplified by the amplification circuit 37. The peak hold circuit 38 is connected to an analog-digital (A/D) conversion circuit 39 where the peak value (analog signal) of the illuminance signal held in the peak hold circuit 38 is converted to a digital signal. The analog-digital conversion circuit 39 is connected to a calibration circuit 40. The digital signal (illuminance signal) converted by the analog-digital conversion circuit 39 is calibrated by the calibration circuit 40. The calibration by the calibration circuit 40 is performed based on a calibration value stored in a calibration value storage device 42 connected to the calibration circuit 40. The calibration value storage device 42 stores calibration values preset in accordance with the type of the exposure use illumination light. In the present embodiment, it stores KrF calibration values for KrF exposure use illumination light and ArF calibration values for ArF exposure use illumination light.

The reason why calibration by the calibration circuit 40 is necessary will be explained next. That is, the digital signal before input to the calibration circuit 40 is a digital signal of an amount corresponding to the illuminance of the light striking the light receiving element, but calculating the illuminance from the digital signal requires correction considering the amplification rate of the amplification circuit 37, the wavelength dependency of the sensor element used in the light receiving element, etc. If not performing such calibration, it is not possible to calculate and display the accurate illuminance signal. Further, in the present embodiment, the light receiving element is irradiated with two types of exposure use illumination light, that is, KrF and ArF, so it is necessary to use two types of calibration values as the calibration values in the calibration circuit 40, that is, the KrF calibration value for the KrF exposure use illumination light and the ArF calibration value for the ArF exposure use illumination light.

The output end of the calibration circuit 40 has connected to it a result data storage device 46 for storing and holding the result data. Data calibrated by the calibration circuit 40 and converted to illuminance is stored and held in the result data storage device 46. The result data stored and held in the result data storage device 46 (data calibrated by calibration circuit 40 and converted to illuminance) may be read by connecting a data reading device (not shown) or host computer 28 etc. to the input/output terminal 45 in accordance with need. Further, the illuminance measurement apparatus circuit 35 may be provided with a radio communication device (including an infrared communication device) to enable the result data to be read out by radio communication.

Further, in this example, the light receiving element and illuminance measurement apparatus circuit 35 are provided integrally on the dummy wafer 34, but it is also possible to provide only the light receiving element on the dummy wafer 34 and form the illuminance measurement apparatus circuit 35 independent from the dummy wafer 34 and connect these members by a flexible connection cable. Further, it is possible to provide a light receiving element and radio communication device on the dummy wafer 34, form the illuminance measurement apparatus circuit 35 independent from the dummy wafer 34, and transfer the detection value from the light receiving element to the illuminance measurement apparatus circuitry 35 by radio communication. In these cases, the result data stored in the result data storage device 46 may be displayed on a display device.

The amplification rate storage device 41 and calibration value storage device 42 may have a switching circuit 43 connected to it in accordance with need. The switching circuit 43 outputs a switching signal to the amplification rate storage device 41, calibration value storage device 42, and/or amplification circuit 37 and calibration circuit 40 so as to switch the amplification rate used in the amplification circuit 37 and the calibration value used in the calibration circuit 40 in accordance with the type of the exposure light IL input to the light receiving element. The switching signal from the switching circuit 43 may be issued based on a selection signal input manually from the input device 44 or may be issued based on a selection signal input from an input/output terminal 45. Further, remote control by the radio communication device is also possible. The input device 44 is not particularly limited, but it is possible to mention dip switches etc. An operator selects the type of the exposure use illumination light to be measured for illuminance (in the present embodiment, KrF or ArF) manually from this input device 44. By using this input device 44 to select the type of the exposure use illumination light, a switching signal is output from the switching circuit 43 and the amplification rate used in the amplification circuit 37 and calibration value used in the calibration circuit 40 are determined and read out from the amplification rate storage device 41 and calibration value storage device 42.

Figure 10:
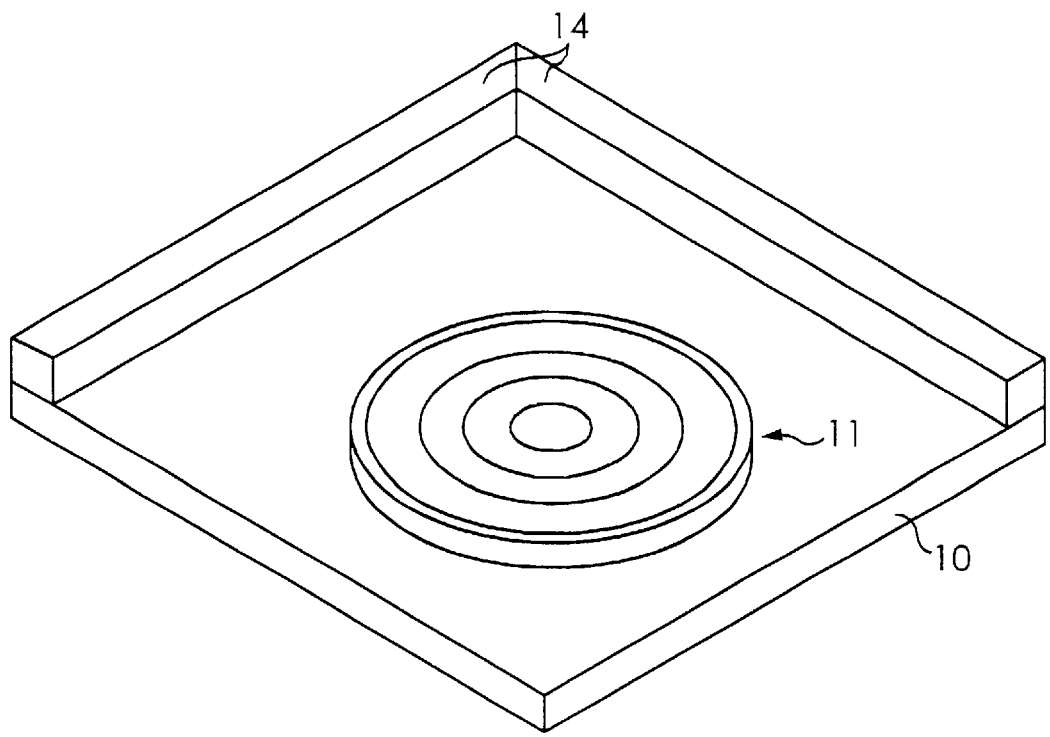
FIG. 10 is a general perspective view of a wafer stage of the second embodiment of the present invention.
Figure 11:
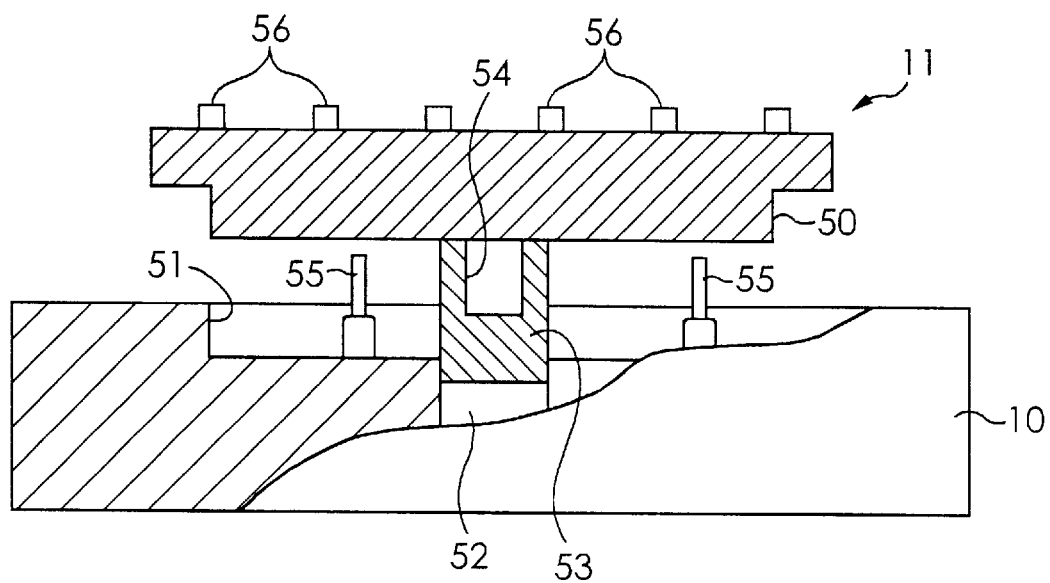
FIG. 11 is a sectional view of principle parts of a wafer stage and wafer holder of the second embodiment of the present invention.

Next, the principal parts of the wafer stage and wafer holder will be explained in further detail. FIG. 10 is a schematic perspective view of the wafer stage. FIG. 11 is a sectional view of the principal parts of the wafer stage and wafer holder. The wafer holder 11 is held by suction on the wafer stage 10. The wafer stage 10 is formed with a circular recess 51 in which the small diameter bottom part 50 of the wafer holder 11 can fit. A circular guide hole 52 is formed passing through the center of the inside bottom of this circular recess 51 in the vertical direction. Inside the guide hole 52 is inserted a holder support member 53 vertically movable along the guide hole 52. The holder support member 53 is designed to be moved up and down by a not shown drive mechanism. That is, the guide hole 52, holder support member 53, and not shown drive mechanism form an attachment/detachment mechanism of the holder.

The top end of the holder support member 53 is formed with a notch 54 having a U-shaped cross-section. This enables the front end of the holder transport arm of a holder automatic transport system (not shown) to be inserted through the notch 54 at the time of exchange of the wafer holder 11. That is, the wafer holder 11 is designed to be able to be exchanged when necessary. Further, the inside bottom surface of the circular hole 51 is provided in the vertical direction with three vertically moving pins 55 forming a wafer vertical movement mechanism for supporting the wafer at three points and moving it up and down at the time of exchange. These vertical movement pins 55 are designed to move up and down in a state where their tips pass through the wafer holder 11 through not shown circular holes provided corresponding to these vertical movement pins 55 in the state with the wafer holder 11 held by suction on the wafer stage 10. Further, the wafer holder 11 has generally concentric circular projections 56. The wafer W is placed on these concentric circular projections. Further, the wafer holder 11 may be a so-called pin chuck holder having a plurality of pins arranged in the circular projections.

Next, the operation when placing a wafer type illuminance measurement apparatus 30 on the above explained wafer holder 11 to measure the illuminance of the exposure light IL will be explained. In the present embodiment, when measuring the illuminance of the exposure light IL, a wafer type illuminance measurement apparatus 30 is stored or placed in a wafer magazine or on a temporary placement base (both not shown) of the exposure apparatus to be measured in the same way as a wafer W, similarly transported as a normal wafer W by a wafer automatic transport system (not shown), and held by suction on the wafer holder 11. Next, the wafer stage 10 is driven and controlled in the XY plane to arrange the reflection surface 33 provided in the wafer type illuminance measurement apparatus 30 in the exposure region of the projection optical system PL. When the reflection surface 33 finishes being arranged in the exposure region of the projection optical system PL, the projection system 17 projects the detection light ID at a plurality of points set in the exposure region of the projection optical system PL to detect the Z-axial direction position of the reflection surface 33 and the tilt of the reflection surface 33 relative to the image plane of the projection optical system PL.

The main control system 16 drives the wafer stage 10 (above-mentioned table) based on the detection results of the tilted incidence optical systems 17 and 18 to control the Z-axial direction position and tilt of the reflection surface 33 and bring the reflection surface 33 into register with the image plane of the projection optical system PL. When the detection surface 32 and reflection surface 33 are arranged in substantially the same plane as shown in FIG. 3, the above processing results in the Z-axial direction position of the detection surface 32 being in register with the Z-axial direction position of the image plane of the projection optical system PL and the detection surface 32 being included in the same plane as the image plane of the projection optical system PL. At this time, when the detection surface 32 and the reflection surface 33 are offset, the main control system 16 reads out the offset stored in the storage unit 19 and corrects the Z-axial direction position by exactly the amount of offset read out.

After the above processing ends, the main control system 16 makes the wafer stage 10 move in parallel in the XY plane via the drive motor 12 while monitoring the positional information measured by the laser interferometer 15 so as to arrange the detection surface 32 provided in the illuminance measurement apparatus 13 in the exposure region of the projection optical system PL and bring the detection surface 32 into register with the image plane of the projection optical system PL. The illuminance of the exposure light IL irradiated on the detection surface 32 is measured in the state with the detection surface 32 in register with the image plane of the projection optical system PL. When the above processing ends, the wafer automatic transport system receives the wafer type illuminance measurement apparatus 30 from the wafer holder 11 and transports it in the same way as a normal wafer W to return it to the wafer magazine or temporary holding base. Next, the operator takes out the wafer type illuminance measurement apparatus 30, connects it to a host computer 28 etc., and reads out the result data stored and held in the result data storage device 46. The result data may be read out at the point of time when measurement of the illuminance of one exposure apparatus is finished or after the measurement of the illuminance of a plurality of exposure apparatuses is finished. Further, it is also possible to automatically measure the illuminance of a plurality of exposure apparatuses by automatically transferring the dummy wafer 34 between adjoining exposure apparatuses.

Note that in the present embodiment, a single illuminance measurement apparatus 30 is used to measure the illuminance while switching the amplification rate used in the amplification circuit 37 and the calibration value used in the calibration circuit 40 in accordance with the light source used by the exposure apparatus to be measured for the illuminance, that is, for KrF use and ArF use, so it is possible to use a single illuminance measurement apparatus 30 to measure both illuminances of a KrF exposure apparatus and ArF exposure apparatus. The illuminance signal measured using the illuminance measurement apparatus 30 is used for calibration of the not shown integrator sensor, illumination uniformity sensor, or other photosensor mounted in the exposure apparatus or matching of the amounts of exposure among the exposure apparatuses 29a to 29d. Further, for example it is possible to switch light receiving elements and use different light receiving elements for the KrF excimer laser light and ArF excimer laser light.

Third Embodiment

Next, a third embodiment of the present invention will be explained in detail. In the second embodiment of the present invention described above, the wafer type illuminance measurement apparatus 30 was used to measure the illuminance of the exposure light IL. The third embodiment of the present invention described below uses a holder type illuminance measurement apparatus instead of the wafer type illuminance measurement apparatus 30 shown in FIG. 8 to measure the illuminance of the exposure light IL in the state with the illuminance measurement apparatus placed on the wafer stage 10. By using this holder type illuminance measurement apparatus, it is possible to improve the work efficiency in the same way as the case of the second embodiment and, even if a plurality of exposure apparatuses are provided as shown in FIG. 7, possible to make the illuminances of the exposure light IL match among the exposure apparatuses.

Figure 12:
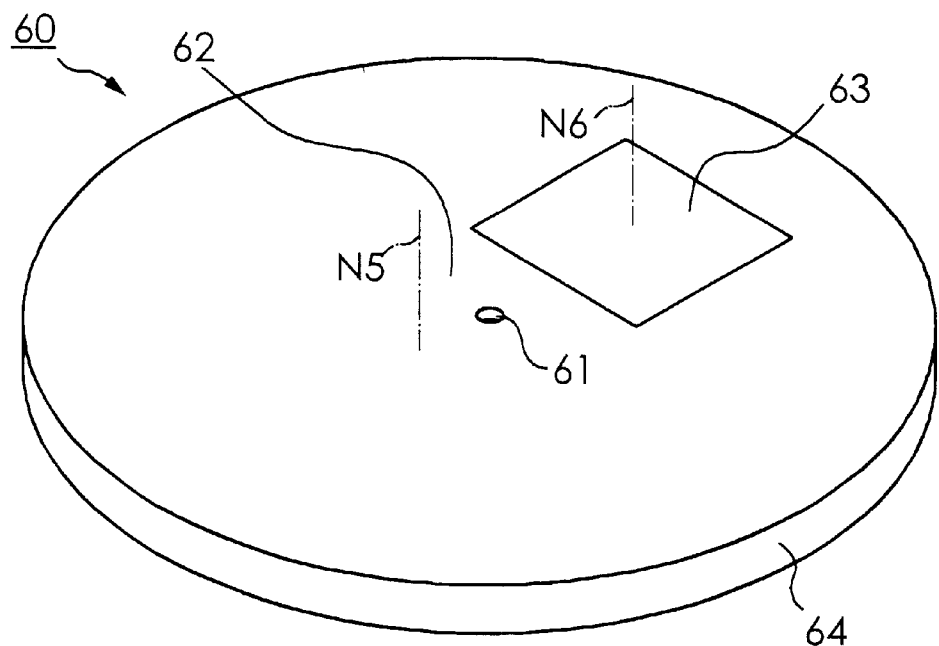
FIG. 12 is a perspective view of the configuration of an illuminance measurement apparatus according to a third embodiment of the present invention.

Below, the holder type illuminance measurement apparatus will be explained in detail. FIG. 12 is a perspective view of the configuration of the illuminance measurement apparatus according to the third embodiment of the present invention. This illuminance measurement apparatus 60 is the same in basic configuration as the wafer type illuminance measurement apparatus 30 according to the second embodiment. That is, it is provided with a dummy holder 64 provided at its top surface with detection surface 62 formed with a pinhole shaped light receiving aperture 61 and a reflection surface 63. The light receiving aperture 61 is provided at the approximate center of the dummy holder 64. Further, while not illustrated in FIG. 12, a light receiving element having a light receiving surface arranged corresponding to the position of formation of the light receiving aperture 61 in the dummy holder is provided in the same way as the wafer type illuminance measurement apparatus 30. The reflection surface 63 is formed to dimensions (for example 15 mm×15 mm) of an extent enabling reflection of the detection light ID in the same way as the reflection surface 33 provided in the wafer type illuminance measurement apparatus 30.

Further, the detection surface 62 and the reflection surface 63 are provided close to each other so that the normal N5 of the detection surface 62 and normal N6 of the reflection surface 63 become substantially parallel. Further, in the same way as in the second embodiment, the reflection surface 63 may be formed so that the reflection surface 63 and the detection surface 62 are arranged in substantially the same plane or the reflection surface 63 may be formed so that it becomes offset relative to the detection surface 62 in the normal direction. In this case as well, it is necessary to arrange the reflection surface 63 at a position where no inconvenience occurs due to multiple reflection between the reflection surface 63 and the projection optical system PL. Further, in the same way as in the second embodiment, the illuminance measurement apparatus circuit 35 shown in FIG. 9 is provided so as to enable measurement of the illuminance of the exposure light IL between exposure apparatuses even in the mixed presence of an exposure apparatus using an KrF excimer laser as a light source and an exposure apparatus using an ArF excimer laser as a light source.

To place the holder type illuminance measurement apparatus 60 explained above on the wafer stage 10, the exposure apparatus of the present embodiment is provided with a transport system for automatically transporting the holder type illuminance measurement apparatus 60 in addition to the above automatic transport system of the wafer W. As explained with reference to FIG. 10 and FIG. 11, the wafer holder 11 is configured to be able to be switched with the wafer stage 10. Therefore, the holder automatic transport system is provided with an articulated robot having a hand for holding the wafer holder by suction, a transport arm, etc., removes and transports the wafer holder 11 held by suction on the wafer stage 10, stores it in a magazine for wafer holders, takes out the holder type illuminance measurement apparatus 60 from the magazine for wafer holders, transports it near the wafer stage 10, and has it held on the wafer stage 10 by suction. When the holder type illuminance measurement apparatus 60 is arranged on the wafer holder 10, the measurement of the illuminance of the exposure light IL is started. The operation at the time of measurement of the illuminance is performed by the same routine as the routine explained in the second embodiment. Note that it is also possible to use this as an automatic transport system between the wafer W and wafer holder (holder type illuminance measurement apparatus 60).

Fourth Embodiment

Figure 13:
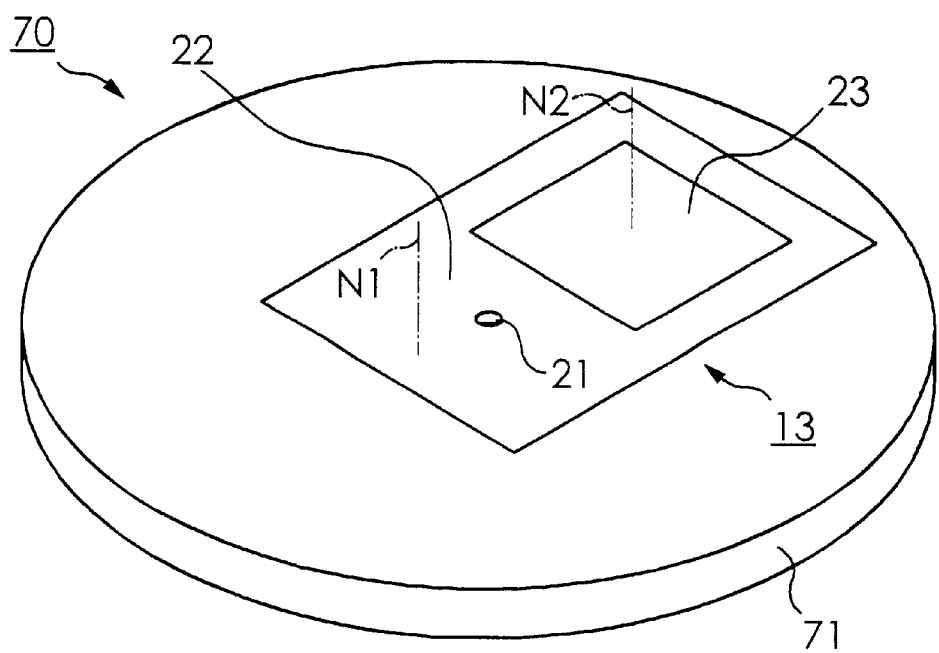
FIG. 13 is a perspective view of the configuration of an illuminance measurement apparatus according to a fourth embodiment of the present invention.

Next, an explanation will be made of an illuminance measurement apparatus according to a fourth embodiment of the present invention. The illuminance measurement apparatus 70 according to the fourth embodiment of the present invention shown in FIG. 13 is a holder type illuminance measurement apparatus similar to the illuminance measurement apparatus according to the third embodiment of the present invention shown in FIG. 12, but is configured housing the illuminance measurement apparatus 13 according to the first embodiment of the present invention shown in FIG. 2 in a holder type adapter 71. That is, the top surface of the holder type adapter 71 is formed wit a recess the same as the outer shape of the illuminance measurement apparatus 13. By fitting the illuminance measurement apparatus 13 in this recess, the illuminance measurement apparatus 70 is formed. Further, even in the case of the presence of both an exposure apparatus using a KrF excimer laser as a light source and an exposure apparatus using an ArF excimer laser as a light source, it is preferable to provide the illuminance measurement apparatus circuit 35 shown in FIG. 9 in the electrical board 26 provided in the illuminance measurement apparatus 13 so as to enable measurement of the illuminance of the exposure light IL between the exposure apparatuses. This holder type illuminance measurement apparatus 70 is placed on the wafer stage 10 by a transport device using in the third embodiment. The illuminance of the exposure light IL is measured by the same routine as explained in the second embodiment and third embodiment.

Note that in the second to fourth embodiments, the illuminance measurement apparatus 13 was shared among a plurality of exposure apparatuses, but it is also possible to use it for a single exposure apparatus as well and possible to use it for only one of the exposure apparatus using the KrF excimer laser as a light source and the exposure apparatus using the ArF excimer laser as a light source. The illuminance measurement apparatus 13 is not limited to the configuration of the embodiments. Further, in the second to fourth embodiments, like in the first embodiment, it is possible to use a one-dimensional line sensor in the illuminance measurement apparatus. Further, in the first embodiment, the wire 24 was used to output the detection signal of the light receiving element 25 to the outside (the main control system 16 etc.), but in the same way as the second to fourth embodiments, it is also possible to configure the illuminance measurement apparatus 13 so as to output a detection signal to the outside using a radio communication apparatus.

Further, in the first to fourth embodiments, it is also possible to arrange a light receiving surface of the illuminance measurement apparatus 13 (light receiving surface of light receiving element or line sensor or one end face of an optical fiber) at the detection surface instead of providing the light receiving aperture in the illuminance measurement apparatus 13. At this time, for example it is preferable the partially deposit chrome etc. on the light receiving surface to a size of the same extent as the above pinhole.

Further, in the first to fourth embodiments, the illuminance measurement apparatus 13 was used to adjust the illuminance of the exposure light IL in the exposure region, but it is also possible to additionally or independently adjust at least one of the illumination distribution of the exposure light IL in the exposure region and the set conditions of the exposure region (weight, size, shape, etc.) Note that to adjust the illumination distribution of the exposure light IL, for example, it is also possible to use an optical element partially blocking the exposure light IL in a plane conjugate with the pattern surface of the reticle R (an incidence plane of the optical integrator 2, etc.) in the illumination optical system (in FIG. 1, including part of the illumination light source 1, the optical integrator 2, the condenser lens 4, etc.) or move at least one optical element of the illumination optical system (for example the optical integrator 2) or drive a density filter in the illumination optical system. Further, the set conditions of the exposure region may be adjusted by driving the reticle blind 6 in FIG. 1.

Further, in the first to fourth embodiments, at the time of measurement of the illuminance, the reticle R may be arranged in the light path of the exposure light IL or the reticle R may be retracted from the light path. If the reticle R is arranged in the light path, however, the exposure light IL can be blocked by the circuit pattern CP depending on its position in the exposure region, so it is possible to arrange a transparent substrate (quartz or other glass plate) of an optical thickness substantially equal to the reticle R in the light path instead of the reticle R. In this case, it is possible to prevent fluctuation in the imaging characteristics of the projection optical system PL (focal position etc.) and possible to improve the precision of measurement of the illuminance.

Further, in the above embodiments, tilted incidence optical systems 17 and 18 were used to detect the position or tilt of the reflection surfaces 23, 33, and 63, but it is also possible to use for example an interferometer etc. and possible to use not an optical system, but an intermolecular microscope, air micrometer, etc.

The illuminance measurement apparatuses according to the first embodiment and fourth embodiment of the present invention explained above arranged the detection surface 22 formed with the light receiving aperture 21 and the reflection surface 23 serving as the reference when measuring the position of the wafer W in the Z-axial direction in proximity to each other, the illuminance measurement apparatus according to the second embodiment similarly arranged the detection surface 32 and reflection surface 33 in proximity to each other, and the illuminance measurement apparatus according to the third embodiment arranged the detection surface 62 and reflection surface 63 in proximity to each other. Therefore, the amount of movement for moving the detection surfaces 22, 32, and 62 into the exposure region of the projection optical system PL from the state where the reflection surfaces 23, 33, and 63 are in register with the image plane of the projection optical system PL is slight. Since almost no offset of the detection surfaces 22, 32, and 62 relative to the image plane of the projection optical system PL occurs due to this movement, it is possible to measure the illuminance of the exposure light IL at a high precision. More precisely, offset occurs due to movement over the distance between the reflection surfaces 23, 33, and 63 and the detection surfaces 22, 32, and 62, but the amount of offset is extremely small compared with the mounting error of a conventional illuminance measurement apparatus and the manufacturing error or assembly error of the pedestal and illuminance measurement apparatus comprised of a plurality of members. Therefore, even if the manufacturing error and assembly error of the pedestal and illuminance measurement apparatus and the mounting error of the illuminance measurement apparatus become larger than the past, the amount of offset due to movement is small and therefore it is possible to measure the illuminance of the exposure light IL with a high precision and therefore possible to reduce the cost.

Further, in the above-mentioned third embodiment and fourth embodiment, the holder type illuminance measurement apparatus 60 comprising the dummy holder (whether or not having a function as a wafer holder) 64 formed to substantially the same shape as the wafer holder 11 and provided integrally with the light receiving element or an illuminance measurement apparatus 70 comprised of the illuminance measurement apparatus 13 arranged inside the holder type adapter 71 was used to replace the wafer holder 11 and measure the illuminance of the exposure light IL. However, it is also possible to measure the illuminances of the exposure apparatuses 29a to 29d by a wafer holder comprised of the wafer holder 11 itself integrally given the light receiving element (photosensor equipped wafer holder). When not measuring the illuminance, this can be used as a normal wafer holder and therefore is more efficient.

Further, the embodiments explained above were given to facilitate the understanding of the present invention and not to limit the present invention. Therefore, the elements disclosed in the above embodiments include all design modifications or equivalents falling under the technical scope of the present invention.

For example, in the above embodiments, reflection surfaces 23, 33, and 63 were provided for detecting both the Z-axial direction positions and the tilts of the detection surfaces 22, 32, and 62 relative to the image plane of the projection optical system PL, but it is not necessarily required to use the reflection surfaces 23, 33, and 63 to detect both of the Z-axial direction positions and tilts of the detection surfaces 22, 32, and 62. The reflection surfaces 23, 33, and 63 are provided for measuring one or more of these. Further, the tilt of the detection surfaces can be either the tilt in one dimension or two dimensions. In view of the measurement accuracy, however, a two-dimensional tilt is preferable.

As the wafer type illuminance measurement apparatus 30, holder type illuminance measurement apparatus 60 or 70, and photosensor-equipped wafer holder, ones able to measure the illuminance by switching between two types: one for KrF and one for ArF—were explained, but the present invention is not limited to this. A type not enabling switching is of source also possible. Further, the combination of the two types of wavelengths is also not limited to the one explained above. The invention can also be used for other combinations of wavelengths. Further, the combinations of different wavelengths are not limited to combinations of two and may be combinations or three or more as well. Further, to detect with a high precision the illuminance of exposure use illumination light having different ranges of incident energy even if the same in wavelength, it is possible to switch between ranges of incident energy.

Further, the circuits or devices forming the circuit 35 of the illuminance measurement apparatus shown in FIG. 1 may be configured by just electrical circuits (hardware) for realizing their functions or may be partially or entirely realized by a microcomputer and software programs.

Further, in the above embodiments, the explanation was given using as examples a step-and-repeat type reduction projection exposure apparatus (stepper) and a step-and-scan type reduction projection scan exposure apparatus (scanning stepper), but the present invention may also be similarly applied to an exposure apparatus of the mirror projection type, proximity type, etc.

Further, instead of an excimer laser, it is also possible to use a harmonic of a YAG laser or other solid laser having an oscillation spectrum at any of a wavelength of 248 nm, 193 nm, and 157 nm. Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

Further, it is possible to use the soft X-ray region emitted from a laser plasma light source or SOR, for example, extreme ultraviolet (EUV) light of the wavelength of 13.4 nm or 11.5 nm. Further, it is possible to use soft X-rays or an electron beam or ion beam or other charged particle beam etc.

The projection optical system is not limited to a reduction system and may also be an equal magnification system or an enlargement system (for example, an exposure apparatus for producing a liquid crystal display or plasma display). Further, the projection optical system may be any of a catoptric system, a dioptric system, and a catadioptric system.

Further, the present invention may be applied to not only an exposure apparatus used for the production of a photomask or semiconductor device, but also an exposure apparatus for transferring a device pattern on a glass plate, used for the production of a display including liquid crystal display elements, an exposure apparatus for transferring a device pattern on a ceramic wafer used for production of a thin film magnetic head, an exposure apparatus used for production of a pickup element (CCD), micromachine, DNA chip, etc.

The exposure apparatus of the present invention may be produced by assembling the illumination optical system comprised of a plurality of lenses and the projection optical system into the body of the exposure apparatus and optically adjusting them, attaching the reticle stage or substrate stage comprised of the large number of mechanical parts to the exposure apparatus body and connecting the wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle based on the design step, a step of production of a wafer from a silicon material, a step of exposing and transferring a pattern of the reticle on to a wafer using the exposure apparatus (lithography system) adjusted by measurement of the illuminance by an illuminance measurement apparatus of the above embodiment, a step of assembly of the device (including dicing, bonding, packaging, etc.), and an inspection step.

As explained above, according to the present invention, since the reflection surface and the detection surface are formed in the same chassis, it is possible to improve the accuracy of measurement of illuminance of illumination light irradiated on the substrate, possible to facilitate processing and assembly work of the illuminance measurement apparatus, and possible to speed and facilitate the work of assembling the illuminance measurement apparatus in the exposure apparatus etc. As a result, it is possible to produce a high performance, high quality microdevice etc. at a low cost with a high throughput.

The present disclosure relates to subject matter contained in Japanese Patent Application No. 2000-246172, filed on Aug. 15, 2000, and Japanese Patent Application No. 2001-245486, filed on Aug. 13, 2001, the disclosure of which is expressly incorporated herein by reference in its entirety.

What is claimed is:

1. An illuminance measurement apparatus, comprising:
   a chassis having a detection surface formed with an aperture,
   a light receiving element having a light receiving surface for receiving a light entered through the aperture, the light receiving surface being arranged at a position corresponding to the aperture in the chassis, and
   a reflection surface on the chassis for reflecting detection light irradiated from a detection device, which receives a light reflected at the reflection surface to detect at least one of the position and posture of the detection surface, the reflection surface being arranged in a plane parallel to the detection surface on the chassis.

2. An illuminance measurement apparatus as set forth in claim 1, wherein the reflection surface is provided close to the detection surface so that the normal of the reflection surface becomes substantially parallel to the normal of the detection surface.

3. An illuminance measurement apparatus as set forth in claim 2, wherein the reflection surface is provided in substantially the same plane as the detection surface.

4. An illuminance measurement apparatus as set forth in claim 2, wherein the reflection surface is offset from the detection surface in the normal direction of the detection surface.

5. An exposure apparatus for transferring a pattern of a mask on to a substrate by exposure light, said exposure apparatus comprising
   a stage which holds said substrate and adjusts at least one of a position and posture of said substrate,
   a detection device which irradiates detection light toward an object on said stage and receives the light reflected at the object to detect at least one of the position and posture of the object,
   an illuminance measurement apparatus, including a chassis having a detection surface formed with an aperture through which said exposure light enters, a light receiving device having a light receiving surface provided at a position corresponding to the aperture in said chassis, and a reflection surface for reflecting said detection light provided on said chassis, and mounted on said stage, and
   a control device which controls said stage so that said detection surface becomes in register with a predetermined reference based on the result of detection of said detection device when irradiating said detection light to said reflection surface.

6. An exposure apparatus as set forth in claim 5, wherein the control device has a storage device storing data showing the relative positional relationship between the reflection surface and the detection surface.

7. A method of production of a device including a step of transferring a device pattern on to a workpiece using the exposure apparatus as set forth in claim 5.

8. An exposure method for transferring a pattern of a mask on to a substrate by exposure light, said exposure method comprising the steps of
   mounting an illuminance measurement apparatus including a chassis having a detection surface formed with an aperture through which said exposure light enters, a light receiving device having a light receiving surface provided at a position corresponding to the aperture in said chassis, and a reflection surface provided on said chassis on a stage for holding said substrate and adjusting at least one of a position and posture of said substrate,
   irradiating detection light toward said reflection surface and receiving the light reflected at the reflection surface to detect at least one of the position and posture of the reflection surface,
   controlling said stage so that said detection surface becomes in register with a predetermined reference based on the result of detection when irradiating said detection light to said reflection surface,
   irradiating said exposure light to said detection surface and measuring the illuminance of said exposure light, and
   adjusting the illuminance of said exposure light and exposing said substrate based on the results of measurement when irradiating said exposure light on said detection surface.

9. A method of exposure of a second object by irradiating exposure light through a first object having a pattern to the second object via a projection optical system, said exposure method comprising:
   arranging a measurement device having a light receiving surface struck by said exposure light on a movable member able to adjust at least one of the position and posture of the same,
   detecting information relating to at least one of the position of a detection surface of the measurement device in an optical axis direction of the projection optical system, and posture of the detection surface of the measurement device relative to an image plane of the projection optical system and
   driving said movable member to bring said detection surface into register with a predetermined reference based on said information so that said measurement device may detect the exposure light.

10. A method of exposure as set forth in claim 9, wherein the information is detected by irradiating detection light to a reflection surface of said measurement device arranged in a predetermined positional relationship with the detection surface and receiving the light reflected from the reflection surface.

* * * * *